United States Patent [19]

Fahey et al.

[11] Patent Number: 5,447,884
[45] Date of Patent: Sep. 5, 1995

[54] SHALLOW TRENCH ISOLATION WITH THIN NITRIDE LINER

[75] Inventors: Paul M. Fahey, Saratoga, Calif.; Erwin Hammerl, Stormville, N.Y.; Herbert L. Ho, Washingtonville, N.Y.; Mutsuo Morikado, Fishkill, N.Y.

[73] Assignee: International Business Machines Corporation, Armonk, N.Y.

[21] Appl. No.: 268,378

[22] Filed: Jun. 29, 1994

[51] Int. Cl.⁶ .......................................... H01L 21/76
[52] U.S. Cl. .................................. 437/067; 437/63; 437/978; 148/DIG. 50
[58] Field of Search ..................... 437/67, 63, 978; 148/DIG. 50

[56] References Cited

U.S. PATENT DOCUMENTS

| | | | |
|---|---|---|---|
| 4,546,538 | 10/1985 | Suzuki | 29/576 |
| 4,631,803 | 12/1986 | Hunter et al. | 437/67 |
| 4,666,556 | 5/1987 | Fulton et al. | 148/DIG. 50 |
| 4,719,185 | 1/1988 | Goth | 437/67 |
| 4,855,804 | 8/1989 | Bergami et al. | 357/49 |
| 4,983,226 | 1/1991 | Hunter et al. | 148/33.2 |
| 5,183,774 | 2/1993 | Satoh | 437/52 |
| 5,189,501 | 2/1993 | Kawamura et al. | 437/67 |
| 5,206,182 | 4/1993 | Freeman | 437/67 |
| 5,250,829 | 10/1993 | Bronner et al. | 257/301 |
| 5,271,972 | 12/1993 | Kwok et al. | 427/579 |

FOREIGN PATENT DOCUMENTS 354128289A 10/1979 Japan .................... H01L 21/76

OTHER PUBLICATIONS

S. R. Stiffler, et al., "Oxidation–Induced Defect Generation In Advanced DRAM Structures", IEEE Transactions on Electron Devices, vol. 37, No. 5, May 1990.
C. W. Teng, et al., "Defect Generation In Trench Isolation", IEDM, CH2099, 1984, pp. 586–589.
R. Conti, et al.,"Electrically Enhanced Trench Isolation For ULSI Applications", IBM Technical Disclosure Bulletin, vol. 32, No. 12, May 1990.

Primary Examiner—Tom Thomas
Assistant Examiner—Trung Dang

[57] ABSTRACT

A method of forming shallow trench isolation with a nitride liner layer for devices in integrated circuits solves a problem of recessing the nitride liner that led to unacceptable voids in the trench filler material by using a liner thickness of less than 5 nm. A densification step of a pyrogenic oxide anneal at 800° C. not only drives out impurities and achieves the same density as a conventional argon anneal at 1000° C., but also drastically reduces the thermal load.

9 Claims, 1 Drawing Sheet

SHALLOW TRENCH ISOLATION WITH THIN NITRIDE LINER

TECHNICAL FIELD

The field of the invention is that of trench isolation integrated circuit processing, including a dielectric layer on the interior of the trench.

BACKGROUND ART

In trench isolated integrate circuits, a known problem has been that of stress caused by the dielectric fill in the trench on the silicon substrate. U.S. Pat. No. 4,631,803 illustrates a set of different liners that are used to relief the stress. One example is an oxide-nitride (ON) layer, another example is a triple layer of oxide-nitride-oxide (ONO). This and other references illustrate a rather thick layer of oxide in the range of 20–45 nm and a relatively thick layer of nitride in the range of 30–60 nm. Another article "Oxidation-Induced Defect Generation in Advanced DRAM Structures" by S. R. Stiffler, et al. in IEEE Transactions on Electron Devices, Vol. 37, No. 5, May 1990 illustrates a relatively thin layer of nitride of thickness 7 nm.

A problem with this and other nitride liners in the art is that when a conventional stripping process of hot phosphoric acid is used to strip the protective pad nitride that coats the wafer, the phosphoric acid recesses the nitride liner, exposing a gap. Subsequent etches in hydrofluoric acid cause that recess to expand into an unacceptably large void.

SUMMARY OF THE INVENTION

The invention relates to a process for forming an isolating trench in which the trench is etched in a reactive ion etching process, and lined with a thin liner of nitride having a thickness <5 nm.

A feature of the invention is the use of a pyrogenic oxide anneal (wet oxidation) at a temperature of about 800° C. This anneal densifies the oxide liner as is conventional, but at a much lower temperature than conventional argon annealing.

BEST MODE OF CARRYING OUT THE INVENTION

Figure 1:
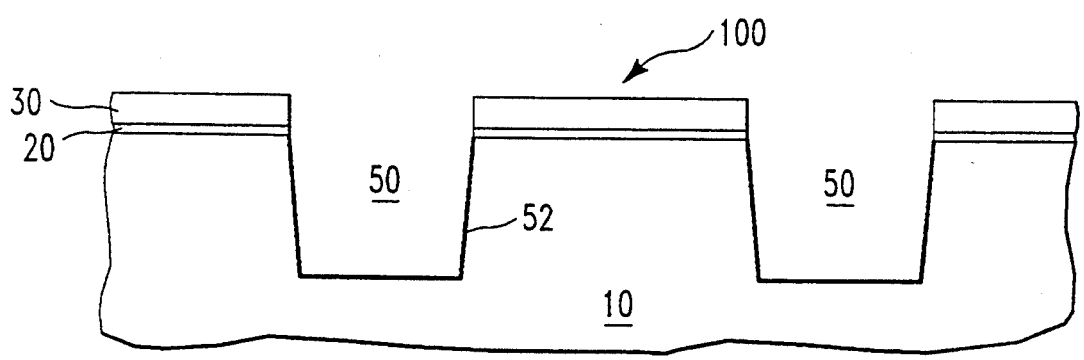
FIG. 1 illustrates in cross-section a portion of a trench according to the invention.

Referring now to FIG. 1, there is shown a portion of an substrate (or epitaxial layer) 10 having a conventional pad oxide liner 20 of thickness about 8 nm and a conventional pad nitride layer 30 of thickness about 150 nm. A conventional reactive ion etching process ($CF_4$—$CHF_3$—Ar) has cut through the oxide and nitride and cut isolation trenches 50 to an illustrative depth of about 0.1–1 μm. A thermal oxidation step has produced a thin layer 52, shown as a thick line in the drawing, of thermal oxide ($SiO_2$) having a nominal thickness of about 20 nm to stabilize the surface. Those skilled in the art are well aware that the top and bottom corners of the trench are susceptible to crystal defects caused by stress produced by the oxidation process. The art has tried a number of methods to relieve the stress, including forming layers of nitride ($Si_3N_4$) and/or oxide.

Figure 5:
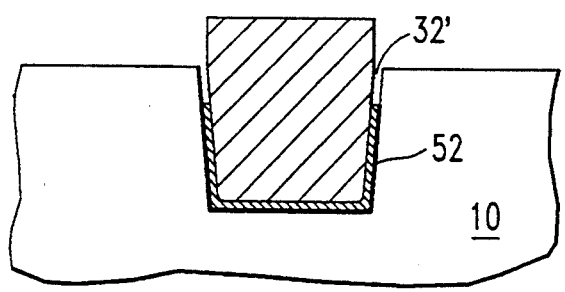
FIG. 5 illustrates in cross-section a prior art trench.

A problem that has been encountered in the prior art is that when pad nitride 30 is stripped in a conventional stripping process using hot phosphoric acid, the phosphoric acid penetrates down along the nitride trench liner and produces a recess. Such a problem is illustrated with respect to FIG. 5 showing a recess 32' that is unacceptable because it exposes the oxide filler 60 in the trench and the oxide liner 52 to attack in subsequent etching steps. Whenever a conventional dip in hydrofluoric acid is used, the recess 32' will be expanded, producing ultimately an unacceptably large void in the trench fill.

Figure 2:
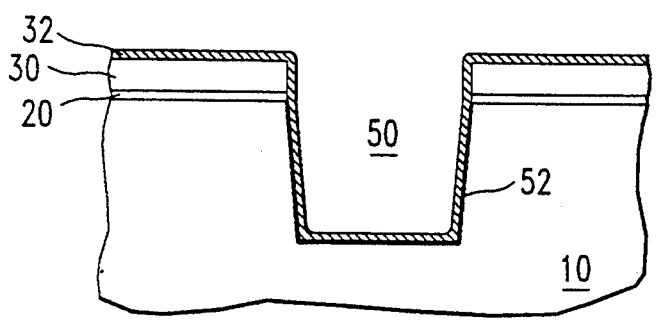
FIGS. 2 to 4 illustrate the trench in subsequent stages of fabrication.

FIG. 2 illustrates the results of a step according to the invention of depositing a layer of 4 nm of LPCVD nitride at a pressure of 200 mTorr with a flow of $NH_3$:$SiH_2Cl_2$ 10:1 for 2 minutes at 770° C. Those skilled in the art will readily be able to vary these parameters to suit their circumstances, such as by changing the temperature (less than 800° C.), flow rate, etc. A preferred embodiment employs a lower deposition temperature, such as 720° C., in order to provide better control of nitride liner thickness. As will be discussed below, such a layer has been discovered to be immune to the recessing problem discussed above.

Figure 3:
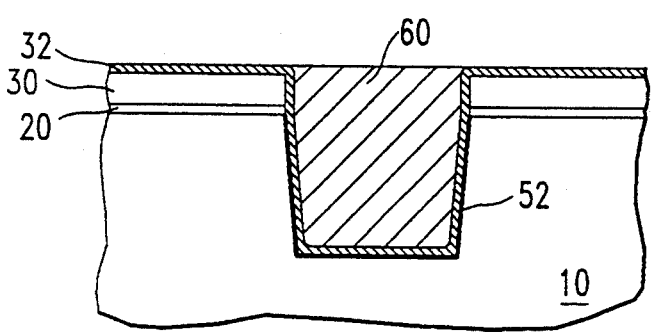

Referring now to FIG. 3, there is shown an oxide liner 60 after deposition of 550 nm of TEOS (tetraethyl-orthosilicate) oxide and a step of annealing and densifying the oxide. The densification step is conducted as a pyrogenic oxidation anneal (wet oxidation, meaning an anneal during oxidation conditions) at a temperature of 800° C. At this temperature, the result of the wet oxidation anneal is comparable in densification of the oxide liner 60 to the results of a conventional annealing step in argon ambient at 1000° C. The etch resistance in hydrofluoric acid is also the same as oxide annealed in argon. The use of the lower temperature has the important benefit that the heat load on the substrate is reduced, and thus the diffusion spread of dopants that have previously been implanted or diffused is much reduced. Oxidizing anneals have not been practiced in the art because of the stress caused by oxidizing a filled trench. If the nitride liner is not perfect, oxygen will diffuse down through the trench material and any holes in a liner into the substrate, causing oxidation behind the nitride liner with a consequent increase in stress. An advantageous feature of the invention is that this and other oxidation steps can be repeated with no detectable crystal defect generation in the vicinity of the trench. It has been observed that a nitride liner of thickness 3 nm formed under the above conditions did permit oxidation of the substrate behind the liner.

An additional benefit of the invention is that the oxidizing ambient can be effective in driving out unwanted impurities from the dielectric. For example, a convenient trench fill process is an ozone assisted TEOS process as disclosed in K. Fujino, et al J. Electrochemical Soc. Vol 137, p. 2883, 1990, in the course of which sizable amounts of fluorine are mixed in with the oxide. The wet oxidation step readily removes the fluorine, which is not the case with an argon anneal.

Figure 4:
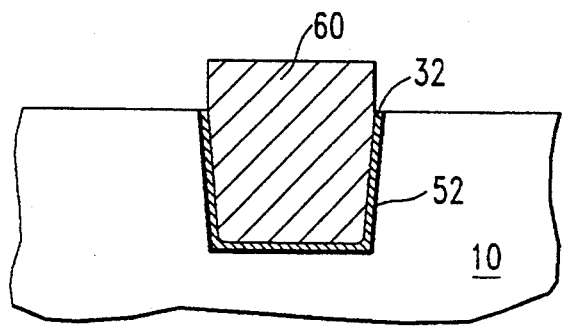

Referring now to FIG. 4, the same trench 50 is shown after the stripping process for the pad nitride and pad oxide. The nitride liner 32 is shown as flush with the substrate surface. It has been observed that, although the 7 nm liner had an etch rate of 10 nm per minute in a conventional hot phosphoric acid bath at 165° C., the 4 nm illustrative layer withstood a nominal 25 minute overetch with no detectable recessing.

As a result of this improvement, the process window for forming shallow trenches and the amount of stress has been considerably increased. Those skilled in the art will readily appreciate that a number of parameters may be varied while still keeping within the concept of the invention and the following claims are not meant to be limited to the embodiment disclosed.

We claim:

1. A method of forming isolation members embedded in a silicon layer of an integrated circuit comprising the steps of:

depositing a protective layer containing at least one layer of nitride on a top surface of a silicon layer;

etching through said protective layer to form a set of isolation mask apertures;

etching through said set of isolation mask apertures in a reactive ion etch process to form a set of isolation trenches;

depositing a conformal layer of nitride having a thickness less than 5 nm;

depositing a CVD layer of oxide having a thickness sufficient to fill said set of isolation trenches;

removing that portion of said CVD layer of oxide outside said set of isolation trenches to expose said at least one layer of nitride; and stripping said at least one layer of nitride in phosphoric acid.

2. A method according to claim 1, in which said step of filling said trench is followed by a step of annealing said CVD layer of oxide in a pyrogenic oxidation anneal.

3. A method according to claim 2, in which said step of filling said trench comprises ozone-assisted deposition of TEOS and in which said step of annealing said CVD layer of oxide in a pyrogenic oxidation anneal drives out fluorine from said CVD layer of oxide.

4. A method according to claim 1, in which said step of filling said trench is conducted at a temperature of less than 800° C.

5. A method according to claim 4, in which said step of filling said trench is followed by a step of annealing said CVD layer of oxide in a pyrogenic oxidation anneal.

6. A method according to claim 5, in which said step of filling said trench comprises ozone-assisted deposition of TEOS and in which said step of annealing said CVD layer of oxide in a pyrogenic oxidation anneal drives out fluorine from said CVD layer of oxide.

7. A method according to claim 1, in which said step of depositing a conformal layer of nitride is preceded by a step of growing a thin layer of thermal oxide.

8. A method according to claim 7, in which said step of filling said trench is followed by a step of annealing said CVD layer of oxide in a pyrogenic oxidation anneal.

9. A method according to claim 8, in which said step of filling said trench comprises ozone-assisted deposition of TEOS and in which said step of annealing said CVD layer of oxide in a pyrogenic oxidation anneal drives out fluorine from said CVD layer of oxide.

* * * * *